(12) United States Patent
Sakurai

(10) Patent No.: US 6,798,171 B2
(45) Date of Patent: Sep. 28, 2004

(54) BATTERY STATE MONITORING CIRCUIT AND BATTERY DEVICE

(75) Inventor: Atsushi Sakurai, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/131,642

(22) Filed: Apr. 23, 2002

(65) Prior Publication Data

US 2002/0172857 A1 Nov. 21, 2002

(51) Int. Cl.[7] .................................. H01M 10/44
(52) U.S. Cl. ..................... 320/132; 320/134; 320/149
(58) Field of Search ................. 320/134, 136, 320/132, 149, 133

(56) References Cited

U.S. PATENT DOCUMENTS

| | | | | |
|---|---|---|---|---|
| 5,493,197 A | * | 2/1996 | Eguchi et al. | 320/116 |
| 5,525,890 A | * | 6/1996 | Iwatsu et al. | 320/106 |
| 5,530,336 A | * | 6/1996 | Eguchi et al. | 320/118 |
| 5,808,446 A | * | 9/1998 | Eguchi | 320/134 |
| 5,847,544 A | * | 12/1998 | Eguchi | 320/136 |
| 5,959,593 A | * | 9/1999 | Hoshi | 343/903 |
| 6,064,182 A | * | 5/2000 | Eguchi | 320/132 |
| 6,495,989 B1 | * | 12/2002 | Eguchi | 320/132 |

* cited by examiner

Primary Examiner—Bao Q. Vu
(74) Attorney, Agent, or Firm—Adams & Wilks

(57) ABSTRACT

The present invention provides a safe battery device by preventing oscillation of an external terminal during a discharge limiting state entered due to an instruction from a microcomputer. When a discharge limiting signal is inputted to a battery state monitoring circuit from an exterior, impedance of an over-current monitor terminal is kept constant.

20 Claims, 5 Drawing Sheets

PRIOR ART FIG. 2

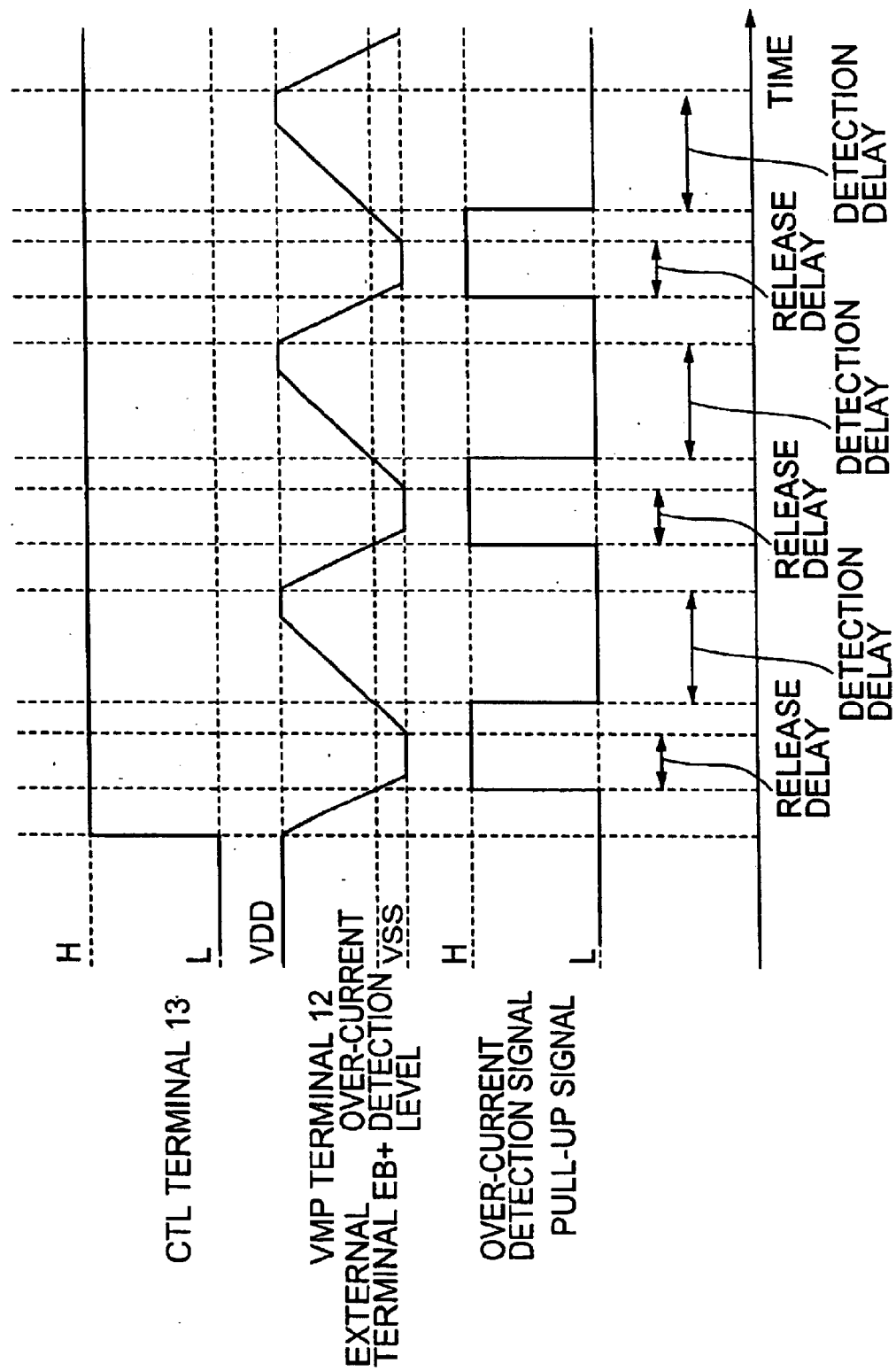
PRIOR ART FIG. 5

BATTERY STATE MONITORING CIRCUIT AND BATTERY DEVICE

BACKGROUND OF THE INVENTION

1. Field of the Invention

The present invention relates to a battery monitoring circuit capable of monitoring a state of a secondary battery and to a battery device provided with the secondary battery, a current limiting means, a battery state monitoring circuit, and the like.

2. Description of the Related Art

As show in FIG. 2, a battery state monitoring circuit 22A is normally provided with battery voltage monitor terminals 5 to 9 or monitoring a plurality of batteries 1 to 4, a COP terminal 10 that serves as a charge control transistor gate connection terminal for controlling the charging of the batteries 1 to 4, a DOP terminal 11 that serves as a connection terminal to a discharge control transistor gate for controlling discharge of the batteries 1 to 4, a VMP terminal 12 that serves as an over-current monitor terminal for monitoring an over-current state of the batteries 1 to 4, and a CTL terminal 13 that serves as a microcomputer control terminal.

In a the battery device, of FIG. 2, the secondary batteries 1 to 4, a charge control transistor 14, a discharge control transistor 16, and a microcomputer 21 are connected with a the battery state monitoring circuit 22A and external terminals EB+ and EB−, respectively.

Either one or both of an external load 19 (for example, a CPU of a notebook personal computer etc.) that is operated by the supply of the electric power of the secondary batteries 1 to 4 and a charger 20 for charging the secondary batteries 1 to 4 is (are) connected between the external terminals EB+ and EB− of a battery device 23A.

When an over-current detection circuit 15 detects that the voltage of the VMP terminal 12 has been lowered by a desired voltage from a VDD, it causes the DOP terminal 11 to output a discharge inhibiting signal "H", to thereby make the FET 16 enter in a state of OFF. This is referred to as a discharge inhibiting state due to an over-current.

Also, during a charge/discharge inhibiting state due to an over-current state, battery state monitoring circuit 22A (specifically, the over-current detection circuit 15 in FIG. 2) causes a pull-Up circuit 18 provided inside thereof be turned on ON and pulls up the VMP terminal 12 to the battery voltage monitor terminal 5 through a given impedance. Accordingly, the impedance of the external load 19 that was the cause of the over-current becomes sufficiently larger than the impedance of the pull-up circuit 18 (that is, there is no fear of occurrence of the over-current) an the potentials of the VMP terminal 12 and the external terminal EB+ nearly reach the value of VDD. The over-current detection circuit 15 detects that the voltage of the VMP terminal 12 has risen by a desired voltage from the VDD and then releases the over-current detection state. This is referred to as a return form the discharge inhibiting state due to the over-current.

On the other hand, when a discharge inhibiting signal (here, the discharge inhibiting signal is referred to as "H") is input to the CTL terminal 13 from a microcomputer 21 due to a cause other than the over-current state, the batter state monitoring circuit 22A causes the DOP terminal 11 to output "H", which causes the FET 16 to turn OFF. This is referred to as to a discharge inhibiting state due to an instruction from a microcomputer.

The discharge inhibiting state due to an instruction from a microcomputer is released by a release signal from the microcomputer.

However in the conventional battery state monitoring circuit 22A and the battery device 23A, when the impedance of the external load 19 is large, there is a problem in that an oscillation of the external terminal EB+ occurs in a cycle described in steps 2. to 5. below during the discharge inhibiting state due to an instruction from a microcomputer. A example of the oscillating waveform is shown in FIG. 5. The oscillation has no influence on the charge/discharge control of the battery device 23A itself. However, there is a problem in that it may adversely affect the peripheral equipment as a noise source.

1. When the discharge inhibiting state by the microcomputer is entered, the FET 16 is turned OFF and the supply of power to the external terminal EB+ is stopped.
2. The external terminal EB+ is pulled down by the external load 19 so that its potential is lowered.
3. In this case, the potential of the VMP terminal 12 is also reduced together with that of the external terminal EB+, so that the batter state monitoring circuit 22A recognizes the discharge inhibiting state due to the over-current.
4. As a result the pull-up circuit 18 is turned ON. In this case, when the impedance of the external load 19 is sufficiently larger than the impedance of the pull-up circuit 18, the VMP terminal 12 and the external terminal EB+ are pulled up so that their potentials approach the VDD potential
5. Accordingly, the battery state monitoring circuit 22A recognizes that he discharge inhibiting state due to the over-current is released, to thereby cause the pull-up circuit 18 to be turned OFF again.
6. The state returns to one described in step 2.

SUMMARY OF THE INVENTION

The present invention has been devised to solve the above-described problem. According to the construction of a battery state monitoring circuit and a battery device of the present invention, even when discharge is in response to an instruction from a microcomputer, an external terminal EB+ does not oscillate so that the occurrence of noise is prevented.

That is, in the case where a discharge inhibiting signal is input to the battery state monitoring circuit from an external source, the impedance of an over-current monitor terminal is kept constant.

BRIEF DESCRIPTION OF THE DRAWINGS

In the accompanying drawings:

FIG. 5 is a graph showing an example of oscillating waveforms of the conventional battery state monitoring circuit and the conventional battery device.

DETAILED DESCRIPTION OF THE PREFERRED EMBODIMENTS

Figure 1:
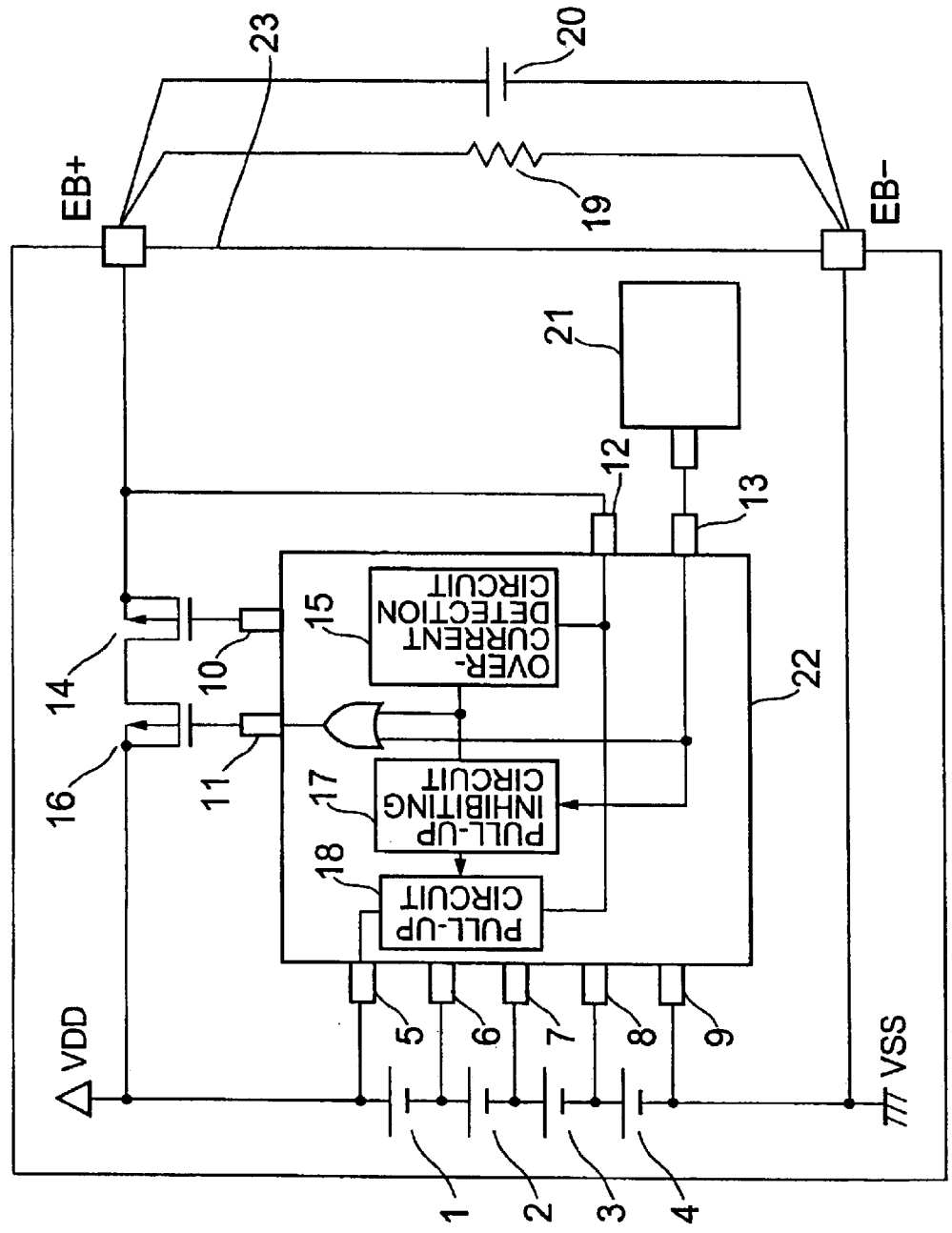
FIG. 1 is a block diagram showing an example of a battery state monitoring circuit and a battery device according to the present invention.
Figure 2:
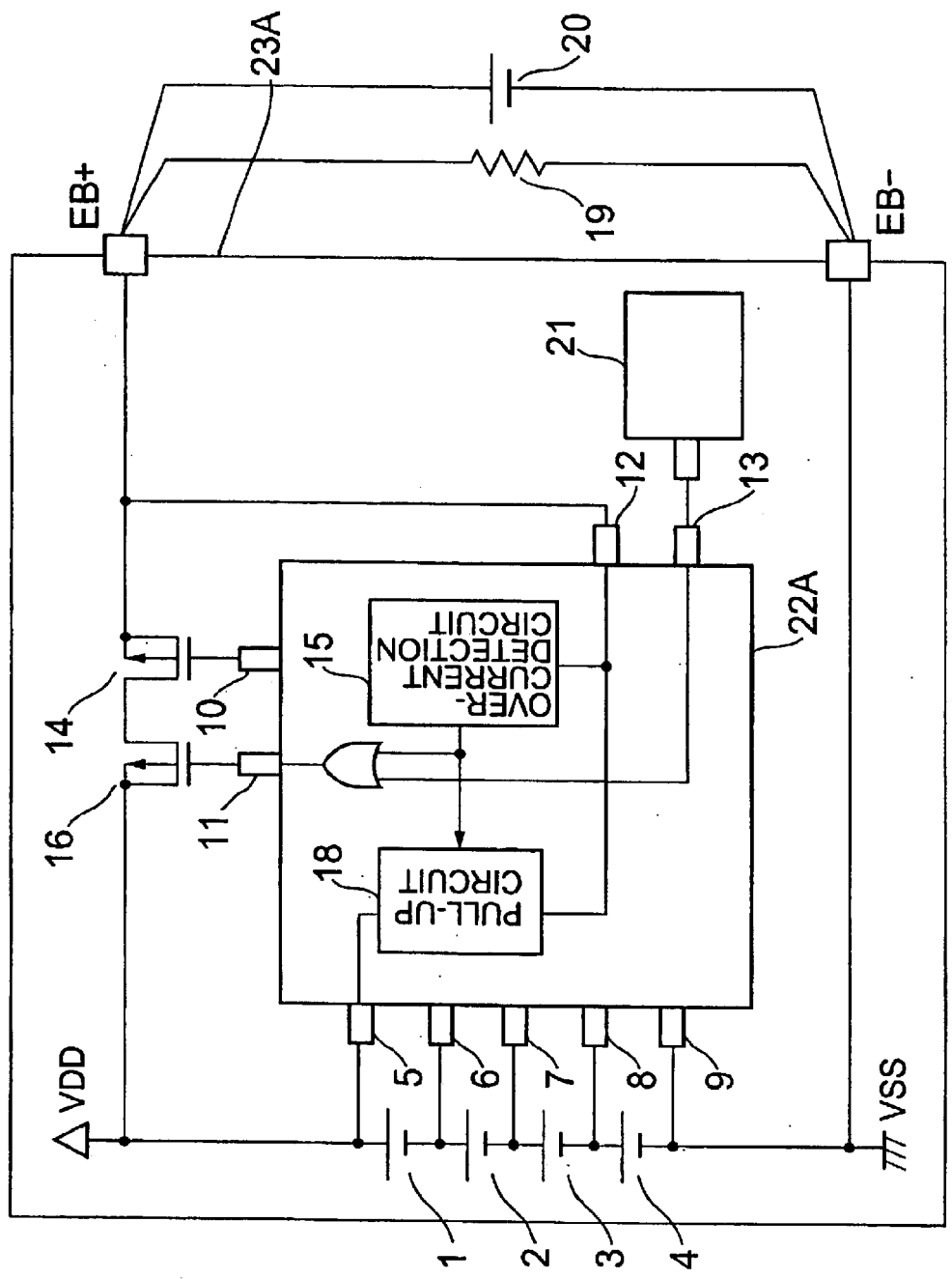
FIG. 2 is a block diagram showing a conventional example of a battery state monitoring circuit and a battery device.

FIG. 1 is a block diagram showing an example of a battery state monitoring circuit and a battery device according to the present invention. Hereinbelow, the present invention will be described with reference to FIG. 1.

As shown in FIG. 1, a battery state monitoring circuit 22 according to the present invention is provided with battery voltage monitor terminals 5 to 9, a COP terminal 10 that serves as a connection terminal to a charge control transistor 14, a DOP terminal 11 that serves as a connection terminal to a discharge control transistor 16, a VMP terminal 12 that serves as an over-current monitor terminal, an a CTL terminal 13 that serves as a microcomputer control input terminal.

In the battery device of FIG. 1, secondary batteries 1 to 4, a charge control transistor 14, a discharge control transistor 16, and a microcomputer 21 are connected with the battery state monitoring circuit 22 and external terminals EB+ and EB−, respectively. According to the construction of FIG. 1, the battery voltage monitor terminal 5 is at the VDD potential and the battery voltage monitor terminal 9 is at the VSS potential. Also, there are some cases where the microcomputer 21 is installed outside the battery device.

Either one or both of an external load 19 (for the example, a CPU of a notebook personal computer etc.) that is operated by the supply of the electric power of the secondary batteries 1 to 4 and a charger 20 for charging the secondary batteries 1 to 4 is (are) connected between the external terminals EB+ and EB− of a battery device 23.

In a normal state where both the FET 14 and the FET 16 remain in an N state so that electric power is enabled to be supplied to the external load 19, the voltage of the VMP terminal 12 is pulled up to the VDD potential through the FET 14 and the FET 16. In this case, when the impedance of the external load 19 is reduced to increase the current, the voltage of the VMP terminal 12 is lowered from the VDD potential due to the on-resistance of the FET 14 and the FET 16. An over-current detection circuit 15 detects that the VMP terminal 12 has been lowered by a desired voltage from the VDD and causes the DOP terminal 11 to output a discharge inhibiting signal "H", to thereby turn OFF the FET 16. This is referred to as a discharge inhibiting state due to an over-current. In this case, since the FET 16 is turned OFF and the power supply is stopped, the external terminal EB+ is pulled down by the external load 19 so that its potential is reduced.

Also, during a charge/discharge inhibiting state that is produced by the over-current, the battery state monitoring circuit 22 (over-current detection circuit 15 in FIG. 1) causes a pull-up circuit 18 provided inside thereof to enter in a state of ON and pulls up the VMP terminal 12 to the battery voltage monitor terminal 5 through given impedance. Accordingly, the impedance of the external load 19 that was the cause of the over-current becomes sufficiently larger than the impedance of the pull-up circuit 18 (that is, there is no fear of occurrence of the over-current) and the potentials of the VMP terminal 12 and the external terminal EB+ approach the VDD. The over-current detection circuit 15 detects that the VMP terminal 12 has risen by a desired voltage from the VDD and then releases the over-current detection state. Therefore, the battery state monitoring circuit 22 causes the FET 16 to enter the state of ON again and allows the battery device 23 to return to the normal state. This is referred to as a return from the discharge inhibiting state due to the over-current.

On the other hand, when a discharge inhibiting signal (here, the discharge inhibiting signal is referred to as "H") is inputted to the CTL terminal 13 from the microcomputer 21 due to a cause other than an over-current, the battery state monitoring circuit 22 causes the DOP terminal 11 to output "H" and makes the FET 16 enter in the state of OFF. This is referred to as a discharge inhibiting state by the microcomputer. In this case, since the FET 16 is in the state of OFF and the power supply is stopped, the external terminal EB+ is pulled down by the external load 19 so that its potential is reduced.

The discharge inhibiting state by the microcomputer is released by a release signal from the microcomputer. Each of operations that are described above is provided with a delay that is suitable for preventing malfunction.

In the battery state monitoring circuit 22 according to the present invention shown in FIG. 1, a pull-up inhibiting circuit 17 is added. When the discharge inhibiting signal is given by the microcomputer, the pull-up inhibiting circuit 17 operates to prevent the pull-up circuit 18 from pulling up the VMP terminal 12 to the battery voltage monitor terminal 5. Accordingly, in occurrence of the discharge inhibiting state from the microcomputer, the following operations are performed.

1. When the discharge inhibiting state by the microcomputer is entered, the FET 16 enters in the state of OFF and the power supply to the external terminal EB+ is stopped. Simultaneously, the pull-up inhibiting circuit 17 is operated.
2. The external terminal EB+ is pulled down by the external load 19 so that its potential is lowered.
3. In this case, the potential of the VMP terminal 12 is also reduced together with that of the external terminal EB+, so that the battery state monitoring circuit 22 recognizes the discharge inhibiting state due to the over-current.
4. In this case, since the pull-up inhibiting circuit has been operated at 1. above, the pull-up circuit 18 remains in the state of OFF.
5. Therefore, the external terminal EB+ and the VMP terminal 12 become open so that they are fixed in the state where the pull-down by the external load 19 is being implemented. That is, the external terminal EB+ does not oscillate.

In the conventional example, when the discharge inhibiting state by the microcomputer is entered, the impedance of the VMP terminal 12 is changed due to ON/OFF of the pull-up circuit 18. However, in the construction of the battery state monitoring circuit and the battery device according to the present invention, the impedance of the VMP terminal 12 that serves as the monitor terminal of an over-current is kept constant during the discharge inhibiting state by the microcomputer, so that there is no fear of oscillation of the external terminal EB+. Consequently, the fear of the peripheral equipment being adversely affected is eliminated, to thereby achieve enhanced safety. In the case of FIG. 1, the VMP terminal 12 is electrically insulated to keep the impedance constant.

Figure 3:
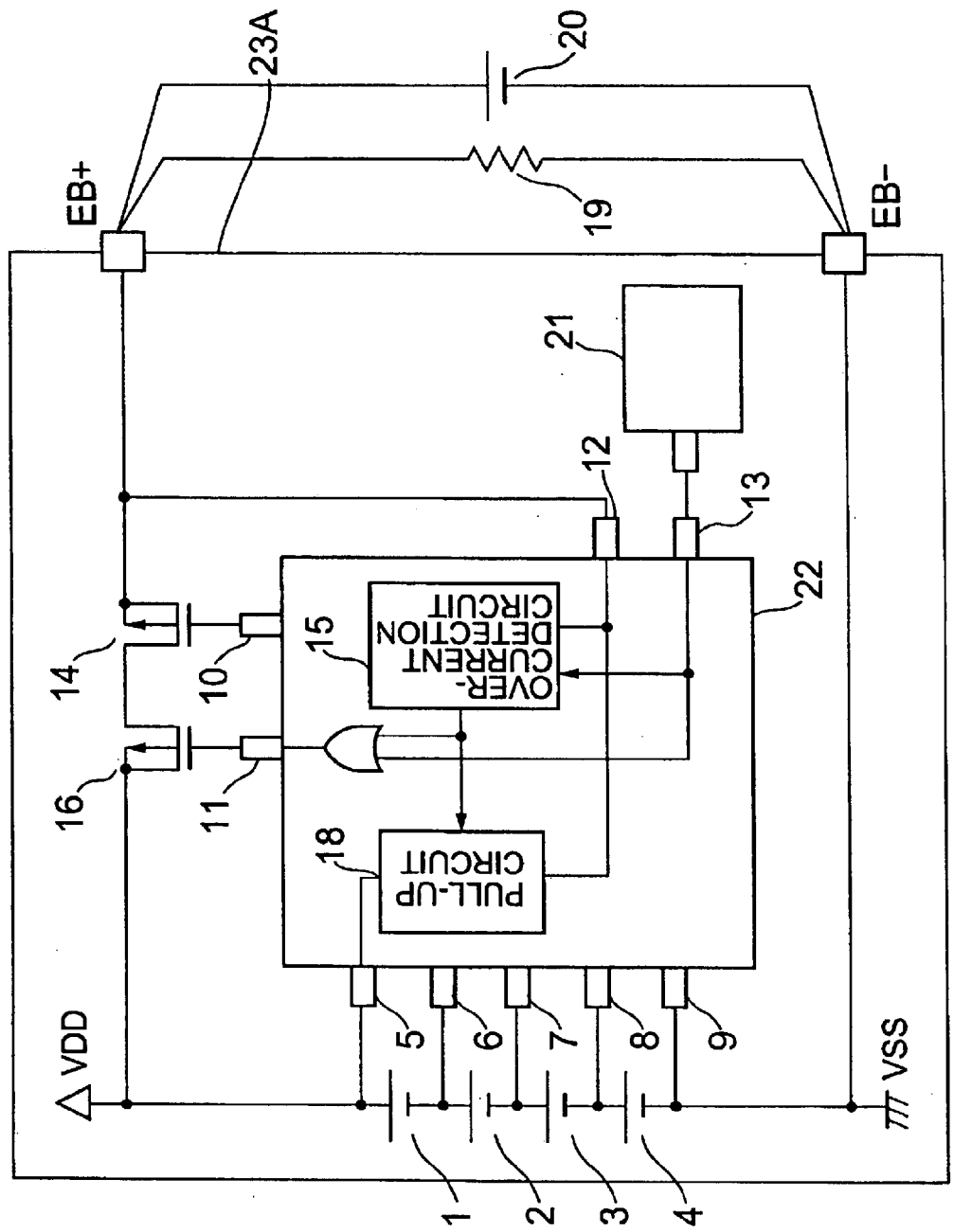
FIG. 3 is a block diagram showing another example of a battery state monitoring circuit and a battery device according to the present invention.

FIG. 3 is a block diagram showing another example of a battery state monitoring circuit and a battery device according to the present invention. In FIG. 3, an over-current detection is inhibited by a discharge inhibiting signal from a microcomputer. Accordingly, in occurrence of a discharge inhibiting state by the microcomputer, the following operations are performed.

1. When the discharge inhibiting state by the microcomputer is entered, a FET 16 enters in the state of OFF and the power supply to an external terminal EB+ is stopped. Simultaneously, the over-current detection is inhibited.
2. The external terminal EB+ is pulled down by an external load 19 so that its potential is lowered.
3. In this case, the potential of a VMP terminal 12 is also reduced together with that of the external terminal EB+. However, since the over-current detection is inhibited, a battery state monitoring circuit 22 does not recognize the discharge inhibiting state due to the over-current.
4. Thus, a pull-up circuit 18 remains in the state of OFF.
5. Therefore, the external terminal EB+ and the VMP terminal 12 become open so that they are fixed in the state where the pull-down by the external load 19 is being implemented. That is, the external terminal EB+ does not oscillate.

Accordingly, also in FIG. 3, there is obtained the effect similar to that in FIG. 1.

Figure 4:
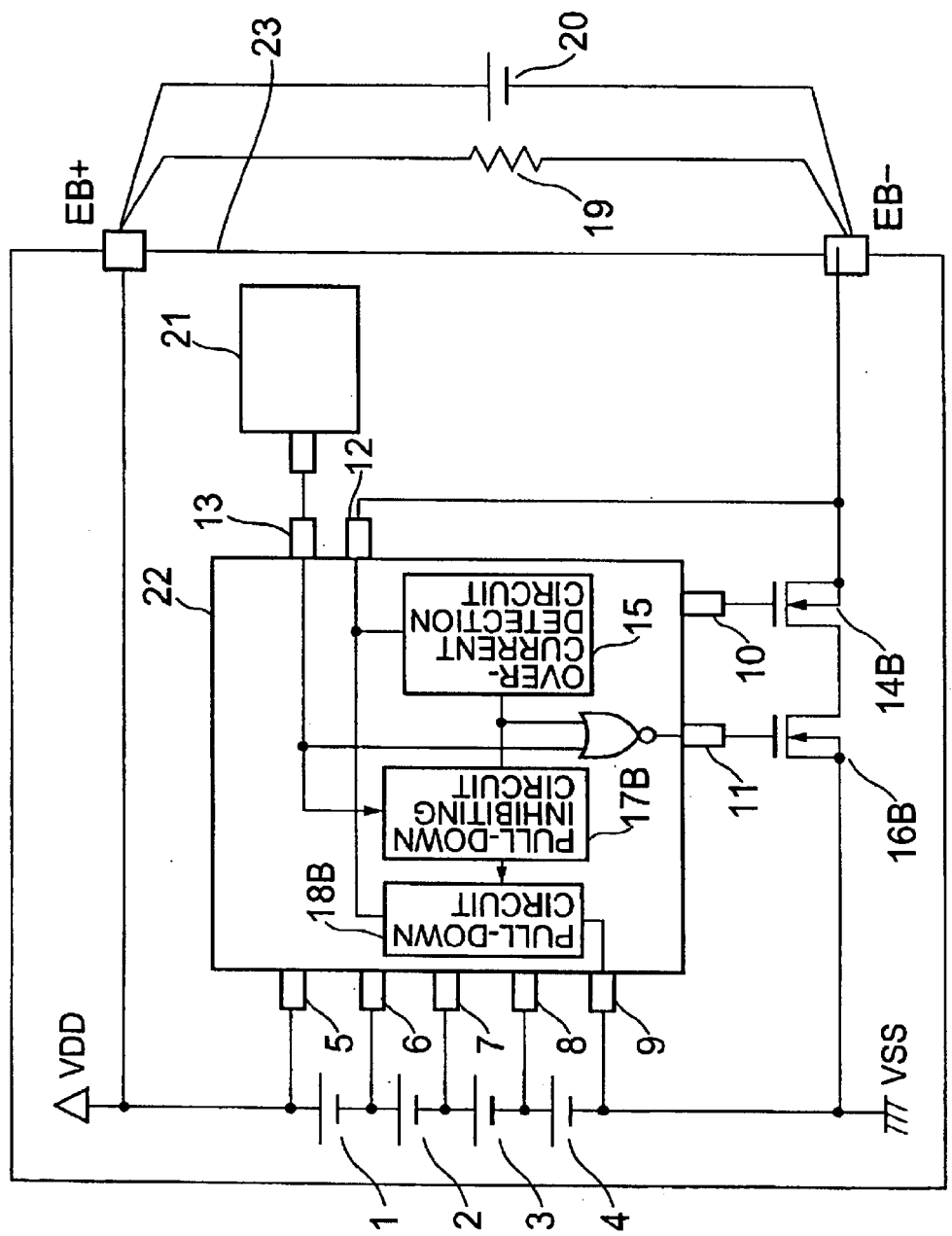
FIG. 4 is a block diagram showing still another example of a battery state monitoring circuit and a battery device according to the present invention.

FIG. 4 is a block diagram showing still another example of a battery state monitoring circuit and a battery device according to the present invention. In this example, a construction similar to that of FIG. 1 is obtained with an NMOS-FET. A FET 14B, a FET 16B, a pull-down inhibiting circuit 17B, and a pull-down circuit 18B are connected instead of a FET 14, a FET 16, a pull-up inhibiting circuit 17, and a pull-up circuit 18, respectively. Although specific description thereof is not made, it is apparent that there is obtained the effect similar to that in FIG. 1. Additionally, though not shown in the drawing, it is apparent that the similar effect is obtained even in the case where the example of FIG. 3 is constructed by adapting the NMOS-FET.

Also, in the battery state monitoring circuit and the battery device according to the present invention, even when the pull-up circuit 18 or the pull-down circuit 18b is fixed while remaining in the ON-state by the discharge inhibiting signal from the microcomputer, the impedance of the VMP terminal 12 is kept constant, thereby preventing oscillation of the external terminal. In this case, the impedance of the VMP terminal 12 is determined by the pull-up circuit 18 or the pull-down circuit 18B, and the potential of the VMP terminal 12 is determined by the balance between the impedance of the pull-up circuit 18 or the pull-down circuit 18B and the external load 19. Thus, an object of the present invention can be achieved.

Additionally, the present invention is also applicable in the case where the number of the connections of the secondary batteries is changed.

Thus, according to the present invention, any circuit construction may be adopted as long as it allows the impedance of the over-current monitor terminal to be kept constant when the discharge inhibiting signal is inputted to the battery state monitoring circuit. Thus, the circuit construction is not limited to those described in the aforementioned embodiments.

As described above, the present invention has a construction such that there is no oscillation of an external terminal and thus no occurrence of noises even when discharge is limited from an external microcomputer, whereby the safety of the battery device and of the electronic equipment employing the battery device can be enhanced.

What is claimed is:

1. A battery state monitoring circuit comprising: a discharge control output terminal connected to a discharge device for controlling a discharge current from a secondary battery; a battery state monitoring input terminal for monitoring at least one of a current and a voltage of the secondary battery; a control signal input terminal for receiving a control signal from an external source for controlling a charge/discharge state of the secondary battery; an over-current monitoring input terminal for monitoring a current of the secondary battery; an over-current detection circuit for detecting an over-current state of the secondary battery; a pull-up circuit for pulling up the over-current monitoring input terminal when the over-current detection circuit detects an over-current state of the secondary battery; an OR circuit having inputs connected to an output of the over-current detection circuit and the control signal input terminal and an output connected to the discharge control output terminal; and an inhibiting circuit for preventing the pull-up circuit from pulling up the over-current monitoring input terminal when the control signal is input to the control signal input terminal.

2. A battery state monitoring circuit according to claim 1; further comprising a charge control output terminal connected to a charge control device for controlling a charging current applied to the secondary battery.

3. A battery state monitoring circuit according to claim 2; wherein the charge control device are FETs.

4. A battery state monitoring circuit according to claim 1; wherein the pull-up circuit is connected to the battery s ate monitoring input terminal and pulls up the voltage at e over-current monitoring input terminal to a voltage at the battery state monitoring input terminal.

5. A battery state monitoring circuit according to claim 1; wherein the secondary battery comprises a plurality of secondary batteries.

6. A battery device having a battery state monitoring circuit according to claim 1; and further comprising external connection terminals; one or more chargeable/dischargeable secondary batteries provided between the external connection terminals; and current limiting means for adjusting currents of the secondary batteries; wherein the battery state monitoring circuit monitors at least one of a voltage and a current of the one or more secondary batteries and controls the current limiting means.

7. A battery state monitoring circuit according to claim 1; wherein the control signal input terminal is connected to a microcomputer.

8. A battery state monitoring circuit comprising: a discharge control output terminal connected to a discharge control device for controlling a discharge current from a secondary battery; a battery state monitoring input terminal for monitoring at least one of a voltage and a current of the secondary battery; a control signal input terminal for receiving a control signal from an external source for controlling a charge/discharge state of the secondary battery; an over-current monitoring input terminal for monitoring current of the secondary battery; an over-current detecting circuit for detecting an over-current state of the secondary battery; a pull-down circuit for pulling down a voltage at the over-current monitoring input terminal when the over-current detecting circuit detects an over-current state of the secondary battery; a NOR circuit having inputs connected to an output of the over-current detection circuit and the control signal input terminal and an output connected to the discharge control output terminal; and an inhibiting circuit for preventing the pull-down circuit from pulling down the over-current monitoring input terminal when the control signal is input to the control signal input terminal.

9. A battery state monitoring circuit according to claim 8; further comprising a charge control output terminal connected to a charge control device for controlling a charging current applied to the secondary battery.

10. A battery state monitoring circuit according to claim 9; wherein the charge control device and the discharge control device are FETs.

11. A battery state monitoring circuit according to claim 8; wherein the pull-down circuit is connected to the battery state monitoring input terminal and pulls down the voltage at the over-current monitoring input terminal to a voltage at the battery state monitoring input terminal.

12. A battery state monitoring circuit according to claim 8; wherein the secondary battery comprises a plurality of secondary batteries.

13. A battery device having a battery state monitoring circuit according to claim 8; and further comprising external connection terminals; one or more chargeable/dischargeable secondary batteries provided between the external connection terminals; and current limiting means for adjusting currents of the secondary batteries; wherein the battery state monitoring circuit monitors at least one of a voltage and a current of the one or more secondary batteries and controls the current limiting means.

14. A battery state monitoring circuit according to claim 8; wherein the control signal input terminal is connected to a microcomputer.

15. A battery state monitoring circuit comprising: a charge/discharge control output terminal connected to a current limiting device for controlling a charge/discharge current of a rechargeable secondary battery; an over-current monitoring input terminal for monitoring a discharge current of the secondary battery; a control signal input terminal for receiving a signal from an external source for controlling the charge/discharge current of the secondary battery; and a circuit for electrically isolating the over-current monitoring terminal when a discharge limiting signal is input to the control terminal from the external source.

16. A battery state monitoring circuit according to claim 15; further comprising a battery state monitoring input terminal for monitoring at least one of a voltage and a current of the secondary battery.

17. A battery state monitoring circuit according to claim 15; further comprising an over-current detection circuit for detecting an over-current state of the secondary battery; a pull-up circuit for pulling up the over-current monitoring input terminal when the over-current detection circuit detects an over-current state of the secondary battery; and an OR circuit having inputs connected to an output of the over-current detection circuit and the control signal input terminal and an output connected to the charge/discharge control output terminal.

18. A battery state monitoring circuit according to claim 17; wherein the circuit for electrically isolating the over-current monitoring terminal comprises an inhibiting circuit for preventing the pull-up circuit from pulling up the over-current monitoring input terminal when the discharge limiting signal is input to the control terminal from the external source.

19. A battery state monitoring circuit according to claim 15; further comprising an over-current detection circuit for detecting an over-current state of the secondary battery; a pull-down circuit for pulling down the over-current monitoring input terminal when the over-current detection circuit detects an over-current state of the secondary battery; and a NOR circuit having inputs connected to an output of the over-current detection circuit and the control signal input terminal and an output connected to the charge/discharge control output terminal.

20. A battery state monitoring circuit according to claim 19; wherein the circuit for electrically isolating the over-current monitoring terminal comprises an inhibiting circuit for preventing the pull-down circuit from pulling up the over-current monitoring input terminal when the discharge limiting signal is input to the control terminal from the external source.

* * * * *